United States Patent
Feng et al.

(10) Patent No.: US 8,887,532 B2
(45) Date of Patent: Nov. 18, 2014

(54) GLASS-FORMING TOOLS AND METHODS

(75) Inventors: Jiangwei Feng, Painted Post, NY (US); Ljerka Ukrainczyk, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 241 days.

(21) Appl. No.: 12/862,014

(22) Filed: Aug. 24, 2010

(65) Prior Publication Data

US 2012/0047953 A1    Mar. 1, 2012

(51) Int. Cl.
*C03B 11/06* (2006.01)
*C03B 11/08* (2006.01)
*C03B 23/02* (2006.01)
*C23C 14/06* (2006.01)

(52) U.S. Cl.
CPC ............ *C03B 11/086* (2013.01); *C03B 2215/32* (2013.01); *C03B 2215/22* (2013.01); *C03B 2215/31* (2013.01); *C03B 23/02* (2013.01); *C23C 14/0641* (2013.01); *C03B 2215/34* (2013.01); *C03B 2215/11* (2013.01); *C03B 2215/44* (2013.01)
USPC ..................................... 65/374.11; 249/114.1

(58) Field of Classification Search
CPC ...... C03B 40/00; C03B 40/02; C03B 40/207; C03B 11/06; C03B 11/086; C03B 2215/11; C03B 2215/22; C03B 2215/31; C03B 2215/32; C03B 2215/34; C03B 2215/38
See application file for complete search history.

(56) References Cited

U.S. PATENT DOCUMENTS

| 4,721,518 | A | * | 1/1988 | Monji et al. | 65/374.11 |
| 4,747,864 | A |   | 5/1988 | Hagerty | 65/102 |
| 4,887,791 | A |   | 12/1989 | Tangari | 249/115 |
| 5,275,637 | A |   | 1/1994 | Sato | 65/66 |
| 5,385,595 | A |   | 1/1995 | McGarry | 65/515 |
| 5,405,652 | A |   | 4/1995 | Kashiwagi | 427/282 |
| 5,538,528 | A |   | 7/1996 | Kashiwagi | 65/275 |
| 5,723,174 | A | * | 3/1998 | Sato | 427/133 |
| 5,885,316 | A | * | 3/1999 | Sato et al. | 65/324 |
| 6,119,485 | A |   | 9/2000 | Hibino | 65/305 |
| 6,588,231 | B1 |  | 7/2003 | Hirota | 65/251 |
| 6,813,906 | B1 |  | 11/2004 | Hirota | 65/323 |
| 7,096,922 | B2 | * | 8/2006 | Hemschemeier et al. | 164/418 |
| 7,562,858 | B2 |   | 7/2009 | Dumm | |

(Continued)

FOREIGN PATENT DOCUMENTS

JP   61197430    9/1986
JP   1148714 A   6/1989

(Continued)

OTHER PUBLICATIONS

JP2000-072452 Machine Translation, Feb. 9, 2012.*

(Continued)

*Primary Examiner* — Matthew Daniels
*Assistant Examiner* — Lisa Herring
(74) *Attorney, Agent, or Firm* — John T. Haran

(57) ABSTRACT

Refractory glass-forming tools, including glass-forming molds incorporating protective metal nitride surface coatings, with optional alumina barrier layers disposed between the mold bodies and coating for high-temperature nitride coating stability, offering particular advantages for the manufacture by direct molding of optically finished glass products such as information display cover glasses from refractory alkali aluminosilicate glasses at molding temperatures up to and above 800° C.

34 Claims, 1 Drawing Sheet

(56) References Cited

U.S. PATENT DOCUMENTS

| | | | |
|---|---|---|---|
| 2004/0244423 A1 | 12/2004 | Boontarika | 65/102 |
| 2005/0247426 A1* | 11/2005 | Flynn | 164/98 |
| 2005/0268662 A1 | 12/2005 | Moore | |
| 2008/0110207 A1* | 5/2008 | Fukuda et al. | 65/66 |
| 2008/0166867 A1* | 7/2008 | Iwamoto et al. | 438/592 |
| 2011/0256807 A1* | 10/2011 | Feng et al. | 451/28 |
| 2012/0003425 A1* | 1/2012 | Brahmandam et al. | 428/141 |

FOREIGN PATENT DOCUMENTS

| | | |
|---|---|---|
| JP | 5078145 A | 3/1993 |
| JP | 11043334 | 2/1999 |
| JP | 2000072452 | 3/2000 |
| JP | 2003275575 | 9/2003 |

OTHER PUBLICATIONS

M. Hock, E. Schaffer, W. Doll, G. Kleer, *Surface and Coating Technology*, 163-164 (2003), p. 689-694.
P. Manns, W. Doll and G. Kleer, *Glastech. Ber. Glass Sci. Technol.* 68 (1995), p. 12.
G. Kleer, E. Kaiser and W. Doll, *Surface and Coating Technology*, 79, (1996), p. 95.
K.Bobzin, E.Lugscheider, O.Knotek, M.Maes, P.Immich and C.Pinero, *Mater. Res, Soc. Symp. Proc. V890*, 2006 Materials Research Society.

* cited by examiner

GLASS-FORMING TOOLS AND METHODS

BACKGROUND

1. Field of the Disclosure

The present disclosure relates to the production of glass articles from high-softening-point silicate glasses, and more particularly to durable tools for forming such glasses at high temperatures.

2. Technical Background

Forming glass articles of complex shape from high-softening-point glasses is challenging due to the high forming temperatures that are necessary to successfully shape the glasses. Technical glasses of the kinds used for advanced consumer electronics applications, particularly including the refractory aluminosilicate glasses used to make cover glass sheet products for information displays (televisions, computer monitors, and mobile electronic devices such as cell phones, as well as touch screens for large and small information displays including whiteboards, pad computers, and advanced handheld devices) can have softening points and/or forming temperatures of 800° C. or higher. At those temperatures conventional glass-forming tools such as molds and dies are rapidly damaged by surface oxidation, mechanical abrasion, chemical corrosion, and/or temperature-induced changes in mold surface composition or microstructure. These changes can become progressively more severe as the molds are repeatedly cycled from low to high temperatures during use.

Especially problematic are refractory glasses containing significant concentrations (e.g., 5% or more by weight) of alkali metal constituents such as sodium. Alkali metals are highly mobile and reactive at high glass-forming temperatures and can cause degradation of mold surfaces that unacceptably reduces the surface quality of molded glass products.

Consumer electronics manufacturers require that glass sheet products supplied for use in information displays are delivered with an optical surface finish. The economics of consumer electronics manufacture do not allow for the imposition of post-forming finishing costs, nor is such finishing even practical where sheet products with 3-dimensional curvature are required.

The cost of durable glass-forming tools is yet another factor affecting the economics of display cover glass manufacture. The need to maintain tight dimensional tolerances as well as optical surface quality in molded display products means that tools offering extended service lives are needed to enable low-cost manufacturing. Metal glass-forming tools fabricated, for example, from iron, steel, or metal alloys comprising iron, nickel, chromium or copper can provide adequate dimensional stability at high temperatures but are subject to problems such as surface oxidation at temperatures as low as 600° C., and to glass sticking through corrosive interactions with reactive glass constituents at temperatures approaching 800° C. Any of these problems can unacceptably degrade optical surface quality in the molded glass products.

Refractory non-metallic molds formed of ceramic materials such as silica, alumina, WC, TiC, TiN, SiC, SiN, or silicon nitride alloys such as Sialon can offer good high-temperature dimensional stability but are much higher in cost than metal molds. In addition, such molds can react with alkali-containing glasses at high forming temperatures, causing glass sticking that results in poor molded glass surface finish. Moreover, surface coatings such as TiAlN, TiAlN/ZrN, $Al_2O_3$ (aluminum oxide, alumina), GaN, precious metals, precious metal alloys, and precious metal-rare earth alloys that have been applied to such molds to improve glass release characteristics or corrosion resistance add even further cost, and have not generally been shown to be effective in enhancing molding performance at use temperatures above about 700° C.

Accordingly, there remains a need for economic glass-forming tooling that can be procured at low cost, that is dimensionally stable at high temperatures, and that incorporates forming surfaces capable of providing shaped products with optically finished surfaces at forming temperatures of 800° C. or higher for prolonged periods of service.

SUMMARY

The present disclosure encompasses glass-forming tools incorporating refractory protective coatings and methods for making and using them. The protective coatings are thermally stable over prolonged periods of thermal cycling, resistant to damage from contact with corrosive high-softening-point glasses, and capable of directly molding optically finished glass surfaces at forming temperatures as high as 800° C. The additional use of selected diffusion barriers against migrating metal contamination enables the coatings to be used to protect refractory metal mold materials otherwise not suited for directly forming optically finished glass articles from high-softening point glasses.

In a first aspect, therefore, the present disclosure encompasses a refractory tool for glass forming or the like comprising a tool body incorporating a glass forming or shaping surface with a protective surface coating. The tool body or at least the glass shaping surface of the tool consists predominantly of a metal selected from the group consisting of iron, nickel, chromium, copper, mixtures thereof, and alloys thereof, and the protective surface coating is a metal nitride coating that is resistant to mechanical, corrosive, and oxidative surface damage at use temperatures of up to 800° C.

Refractory tools provided in accordance with this aspect of the disclosure include glass-forming dies and molds. Exemplary embodiments offering particular advantages for high-temperature glass molding include a glass-forming mold comprising a metallic molding surface, a refractory metal nitride surface coating disposed on at least a portion of the molding surface, and a diffusion barrier layer comprising amorphous aluminum oxide disposed between the molding surface and the surface coating.

Another aspect of the disclosure relates to methods for fabricating the disclosed tooling. Embodiments include a method for making a glass-forming mold comprising the steps of: (i) selecting a mold body having a metallic molding surface consisting predominantly of a metal selected from the group consisting of iron, chromium, nickel, copper, mixtures thereof, and alloys thereof; (ii) depositing an oxide diffusion barrier layer against transition metal or alkali metal diffusion on at least a portion of the molding surface; and (iii) depositing a metal nitride surface coating on the diffusion barrier layer.

Still further aspects of the disclosure relate to methods for molding a glass article having an optical surface finish. Particular embodiments include a method comprising the steps of providing a charge of a softened silicate glass and shaping the charge into a glass article having an optical surface finish using a mold, wherein the silicate glass is an aluminosilicate glass having an alkali metal oxide content in excess of 5 weight percent and wherein the mold comprises a metallic molding surface provided with a metal nitride surface coating resistant to alkali corrosion and oxidation damage up to temperatures of at least 800° C.

BRIEF DESCRIPTION OF THE DRAWINGS

Illustrative embodiments of the tools and methods provided in accordance with the present disclosure are detailed below with reference to the appended drawings wherein.

DETAILED DESCRIPTION

Figure 1:
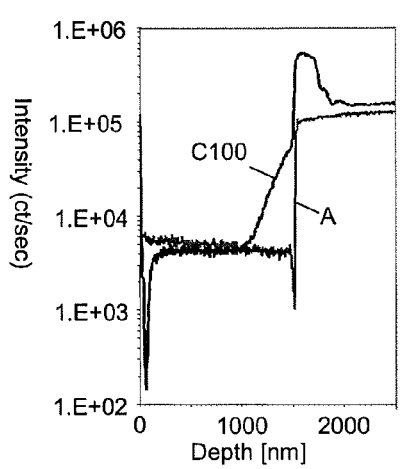
FIG. 1 is a plot of metal concentration versus depth in a nitride protective coating.

While the presently disclosed glass-forming tools and methods are broadly applicable to the field of glass manufacture, particularly advantageous embodiments include glass-forming molds for the production, by direct molding, of glass sheet products having optically finished surfaces, especially including products made from high-softening-point alkali aluminosilicate glasses comprising 5% or more of alkali metal oxides. Accordingly, the following descriptions include specific references to such molds and methods even though the scope of the present disclosure is not limited thereto.

The central problem connected with the manufacture of formed glass sheet for information display applications is that the direct molding of relatively large sections of glass sheet having optically finished surfaces as molded is required. While the use of ceramic glass-forming molds is practical for the production of smaller optical components such as aspheric camera lenses from less refractory, non-silicate glasses, the use of ceramic molds is not economical for large sheet reforming processes. The application of the protective metal nitride coatings disclosed herein enables the use of molds formed entirely of, or at least incorporating molding or shaping surfaces formed of, selected hard refractory metals. That is, the disclosed nitride coatings enable the use of refractory metals that, while generally considered to have high hardness and high oxidation resistance, do not alone provide adequate resistance to oxidation and/or mold corrosion for the molding of refractory cover sheet glass compositions at the glass contact temperatures required for forming such compositions. Embodiments wherein the metal nitride protective coating is formed of a TiAlN composition exhibit excellent oxidation resistance, good glass release characteristics, and the high hardness needed for good abrasion resistance.

Molds suitable for use in combination with the disclosed barrier layers and protective coatings include those incorporating molding surfaces consisting at least predominantly of a metal selected from the group consisting of iron, nickel, chromium, copper, mixtures thereof, and alloys thereof. By "consisting predominantly" is meant a metal, metal mixture or metal alloy wherein metals from the above group make up more than 50% by weight of the metal, mixture, or alloy. Illustrative examples of such metals include cast iron, steels or steel alloys such as H13, S7 and P20, stainless steels 309, 310 and 420, and nickel alloys such as the Hastelloy® and Inconel® alloys. Nickel alloys in particular, with Inconel® 718 alloy being a specific example, are known for their high temperature hardness and oxidation resistance.

Hardness is an important characteristic in a molding surface for glass forming because it reduces likelihood of mold abrasion or scuffing by the glass over time. High temperature oxidation resistance in glass contact surfaces is critical to prevent oxide growth during high-temperature glass forming. Extensive oxide growth on mold surfaces increases the surface roughness of the mold and eventually results in damage to pressed glass surfaces, making it difficult to sustain a molded surface roughness below 25 nm RMS in the shaped glass products.

Particular embodiments of TiAlN coatings offering excellent oxidation resistance and hardness in accordance with the present disclosure are aluminum-rich coatings; i.e., coating having a Ti/Al atomic ratio less than 1. TiAlN coating embodiments wherein the aluminum content does not exceed 70% by weight of the total Al+Ti content of the coating, e.g., an aluminum content not exceeding 67% by weight of that total content, are useful to suppress aluminum nitride formation. Although these coatings are in fact subject to some surface oxidation at temperatures in the 800° C. range, that oxidation is self-limiting and does not result in the loss of the optical surface finish of the as-applied coatings.

While the oxidation resistance, hardness and glass-release characteristics of TiAlN protective coatings are well suited for high-temperature glass forming, such coatings are not fully stable against deterioration during long-term use when deposited directly on metal mold surfaces. The observed coating deterioration is presently attributed to metal migration into the coatings at high temperatures, including both alkali migration into the coating from the glass and transition metal migration into the coating from the metal molding surface.

Analytical data collected from TiAlN coatings disposed on Inconel® nickel alloy substrates after repeated thermal cycling between 450° C. and 800° C. show alkali metal (sodium) diffusion from the glass into the coatings to a depth of 400 nm after 500 thermal cycles, and transition metal (e.g., Fe, Cr, Ni, Nb, etc.) diffusion from the alloy substrates into the coatings to a depth of 500 nm after 100 thermal cycles. In the latter case the properties of the surfaces of the substrates as well as the properties of the nitride protective coating can be compromised.

The use of aluminum oxide as a barrier against metal ion diffusion has a number of advantages, including the ability of the oxide to withstand high temperatures and to resist or retard the diffusion of transition metals such as chromium at such temperatures. However, aluminum oxide alone is not a suitable coating for molds because it does not have good glass release characteristics and is difficult to deposit with low surface roughness. Depositing a nitride protective coating over an alumina barrier layer disposed on a metal molding surface addresses both of these shortcomings.

Particular embodiments of protectively coated molds for the manufacture of optically finished glass articles include molds wherein the metal nitride protective coating on the molding surface of the mold consists essentially of titanium aluminum nitride having an optical surface finish, and wherein an aluminum oxide-containing diffusion barrier layer is provided between the molding surface and the metal nitride protective surface coating. For the purposes of the present description, an optical surface finish or an optically finished coating or molded glass article is an article, coating, or surface finish having an RMS surface roughness not exceeding 25 nm.

The coating combination of a titanium aluminum nitride protective coating over an alumina diffusion barrier layer imparts high thermal stability to a coated metal molding surface. Aluminum oxide, and most particularly amorphous aluminum oxide, acts as a highly efficient barrier against diffusion into the coating of metallic mold species such as Fe, Cr, Ni, Nb and Mo that can degrade the resistance of the TiAlN coating to mechanical, corrosive, and oxidative surface damage. For the purposes of the present description, a coating is considered to be resistant to such damage if it can maintain an optical surface finish as defined above following 100 or more molding cycles against alkali aluminosilicate glasses at 800° C. glass contact temperatures.

Figure 2:
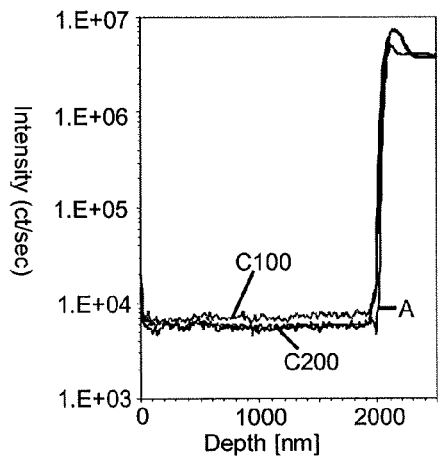
FIG. 2 is a plot of metal concentration versus depth in an alumina barrier layer.

FIGS. 1 and 2 of the drawings compare the high temperature transition metal diffusion characteristics of a vapor-deposited TiAlN protective coating (FIG. 1) with those of a vapor-deposited amorphous alumina barrier layer (FIG. 2). Each material is deposited as a coating on a nickel alloy substrate (Inconel® 718 nickel alloy), and each is subjected to repeated thermal cycling between 450° C. and 800° C., after deposition and after initial concentration profiling, to evaluate the effects of metal diffusion from the alloy substrates into the coatings. The TiAlN coating has a thickness of about 1.5 µm and the alumina layer has a thickness of about 2 µm.

The drawings present secondary ion mass spectrometry (SIMS) depth profiles showing relative nickel concentration (in terms of signal counts per second) as a function of measurement depth for each of the coated substrates, both as deposited (A) and after thermal cycling for 100 (C100) or 200 (C200) thermal cycles. In each case, the metal ion depth profiles are quite steep at the alloy-coating interface when evaluated before thermal cycling.

After thermal cycling, the C100 profile for the TiAlN-coated substrate shows significant nickel migration from the alloy substrate into the coating. In contrast, the C100 and C200 profiles for the alumina-coated substrate show essentially no nickel migration. Similar effects are observed for profiling runs wherein the SIMS analyses track Fe, Cr, Mo or Nb diffusion from the Inconel® alloy substrates into these coatings.

As noted above, the fabrication of a glass-forming mold suitable for the manufacture of optically finished glass products by direct molding comprises an initial step of depositing an oxide diffusion barrier layer, e.g., a layer comprising amorphous aluminum oxide, on at least a portion of the metallic molding surface of the mold. Thereafter, a protective metal nitride surface coating, such as a coating consisting predominantly or essentially of titanium aluminum nitride, is deposited over the diffusion barrier layer.

Depending upon the particular methods employed for the deposition of the alumina barrier layer and TiAlN protective coating, it may in some instances be useful to employ steps to improve the bonding between the molding surface and the barrier layer, and between the barrier layer and the protective coating. In accordance with some embodiments, mold/alumina barrier layer bonding and compatibility are improved by applying an electroless nickel plating layer to the molding surface prior to alumina deposition.

A useful measure for improving adherence between the barrier layer and the protective nitride coating comprises providing an aluminum oxynitride, aluminum-titanium oxynitride, or other metal oxynitride transition layer on the barrier layer. Such a transition layer can be conveniently provided through vapor deposition, e.g., by physical vapor deposition in a gas atmosphere in a process wherein the oxygen content is decreased and the nitrogen content is increased in the atmosphere during the vapor deposition step.

The glass-forming mold produced in accordance with this procedure includes an aluminum oxynitride or aluminum-titanium oxynitride transition layer disposed between and well-bonded to both the barrier layer and the surface coating. In typical embodiments, the protective TiAlN surface coating in such a mold typically has a thickness of at least 1 µm, the oxynitride transition layer has a thickness of at least 10 nm, e.g., 10-300 nm, and the barrier layer has a thickness of at least 200 nm, e.g., 200-1500 nm.

Figure 3:
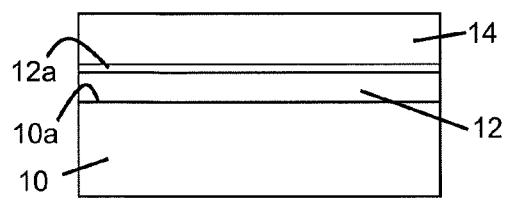
FIG. 3 is a schematic view of a first glass-forming mold.

FIG. 3 of the drawings presents a schematic elevational view, not in true proportion or to scale, of an end face of a glass-forming mold provided in accordance this embodiment of the present disclosure. The elements of the mold 10 illustrated in FIG. 3 include a metallic molding surface 10a, an amorphous alumina barrier layer 12 disposed on the molding surface, and a TiAlN protective coating layer 14 disposed over the barrier layer and in contact with a gradient $Al_2O_3$—AlN transition layer 12a between the barrier layer and TiAlN protective coating.

For high temperature, high wear applications, it is advantageous to deposit protective TiAlN coatings under an electrical bias in order to improve the density and resulting hardness of the coatings. Embodiments of the disclosed methods useful for that purpose include those wherein the protective surface coating is deposited by reactive sputtering from a Ti—Al source, with sputtering being carried out while maintaining an electrical bias between the source and the barrier layer. Reactive sputtering is conveniently carried out in a reaction chamber wherein a reactive gas of nitrogen (i.e., a reactive gas containing nitrogen atoms or ions) and a working gas of Ar are introduced into the chamber after air has been substantially removed therefrom.

Where an electrically biased deposition of TiAlN is the selected protective coating deposition method, maintaining a proper bias between the source and the barrier layer is complicated by the insulating properties of the alumina barrier layer. In accordance with the present disclosure, this difficulty is addressed by modifying or supplementing the composition or structure of the barrier layer to provide an electrically conductive region disposed on or within the barrier layer.

Embodiments of the disclosed methods for achieving this result include methods wherein the step of depositing the barrier layer comprises the non-reactive sputtering onto the molding surface of a barrier layer, wherein the barrier layer comprises an electrically conductive mixture of amorphous aluminum oxide and metallic aluminum. A metallic Al or AlTi bonding layer is then deposited onto the electrically conductive barrier layer. The aluminum/aluminum oxide barrier layer thus provided is believed to comprise interconnected aluminum nanoparticles in an alumina matrix. The Al or AlTi bonding layer improves adhesion between the barrier layer and the protective TiAlN coating. The mold resulting from the use of this method is one wherein a metallic aluminum-containing bonding layer is disposed between the barrier layer and the protective surface coating, and wherein the electrically conductive region consists of the barrier layer or a portion thereof that contains an interconnected aluminum metal phase.

Figure 4:
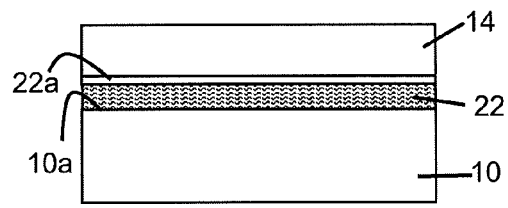
FIG. 4 is a schematic view of a second glass-forming mold.

FIG. 4 of the drawings presents a schematic elevational view, not in true proportion or to scale, of an end face of a glass-forming mold with an electrically conductive barrier layer provided in accordance this embodiment of the present disclosure. As illustrated in FIG. 4 the structure of the mold includes a mold body 10 having a metallic molding surface 10a, an electrically conductive Al—$Al_2O_3$ barrier layer 22 disposed on molding surface 10a, an AlTi bonding layer 22a on the barrier layer, and a TiAlN protective coating 14 disposed on the bonding layer. Typical layer thicknesses for a mold of this construction are 200-1500 nm for the Al/$Al_2O_3$ composite barrier layer, 1000-1500 nm for the TiAlN protective coating, and 1-2 nm for the Al or AlTi bonding layer.

An alternative method for providing similar results for electrically biased TiAlN deposition includes a method wherein the step of depositing the barrier layer comprises vapor-depositing an electrically conductive layer of amorphous alumina doped with ZnO onto the mold surface. The resulting mold is one wherein the electrically conductive region is either the entirety of or portion of the barrier layer containing the ZnO dopant, and wherein an aluminum-titanium oxynitride transition layer is provided between the barrier layer and the protective surface coating.

Figure 5:
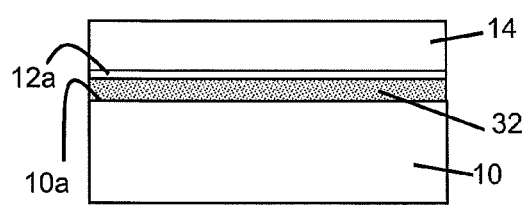
FIG. 5 is a schematic view of a third glass-forming mold.

FIG. 5 of the drawings presents a schematic elevational view, not in true proportion or to scale, of a portion of an end face of a glass-forming mold with an electrically conductive ZnO-doped alumina barrier layer in accordance with this embodiment. Included in the mold of FIG. 5 are a mold body 10 having a metallic molding surface 10a, an electrically conductive ZnO-doped alumina barrier layer 32 disposed on the molding surface, a gradient $Al_2O_3$—AlN transition layer 12a disposed on the barrier layer, and a TiAlN protective coating 14 disposed on the transition layer. Suitable layer thicknesses for a mold of this construction are 200-1500 nm for the ZnO—$Al_2O_3$ barrier layer, 10-300 nm for the gradient $Al_2O_3$—AlN transition layer, and 1000-1500 nm for the TiAlN protective coating.

Yet another method for effecting electrically biased TiAlN coating deposition comprises a step, prior to depositing the TiAlN protective surface coating, of depositing a conductive metal interlayer over the barrier layer and onto at least a portion of the molding surface. One method for forming such a structure is to mask an edge portion of the molding surface prior to the deposition of the alumina barrier layer, and then to remove the mask prior to the deposition of the conductive metal interlayer onto the barrier layer and at least a portion of the molding surface. Suitable conductive metal layers for these embodiments include metal layers comprising a TiAl alloy. The mold resulting from the practice of this method is one wherein the electrically conductive region comprises a conductive metal layer disposed over the barrier layer and in electrical contact with the molding surface.

Figure 6:
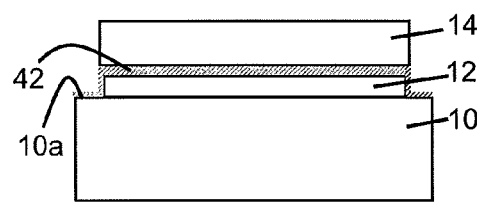
FIG. 6 is a schematic view of a fourth glass-forming mold.

FIG. 6 of the drawings presents a schematic elevational view, not in true proportion or to scale, of a portion of an end face of a glass-forming mold incorporating a conductive metal layer over the barrier layer in accordance with this embodiment. The mold of FIG. 6 includes a mold body 10 having a metallic molding surface 10a, an alumina barrier layer 12 disposed on the molding surface, an electrically conductive TiAl alloy interlayer 42 disposed over the barrier layer but in contact with molding surface 10a, and a TiAlN protective coating 14 disposed on the conductive interlayer. Suitable layer thicknesses for this mold construction are 200-1500 nm for the $Al_2O_3$ barrier layer, 20-100 nm for the conductive metal interlayer, and 1000-1500 nm for the TiAlN protective coating.

As noted above, the methods provided in accordance with the present disclosure include methods for making glass articles having directly molded optically finished surfaces from the refractory molding tools herein described. Such methods comprise providing a charge of softened alkali aluminosilicate glass and shaping the softened charge into a glass article using a mold with a protective oxidation- and corrosion-resistant metal nitride surface coating such as TiAlN. For consumer electronics applications, the charge of softened glass is typically in the form of a glass sheet, and shaping the charge comprises re-forming the glass sheet into a shaped sheet for a display cover glass having an optical surface finish.

In particular embodiments the step of shaping the charge to provide a glass product with an optical surface finish comprises pressing the glass charge and mold together at a glass viscosity in the range of $10^{10}$ to $10^{7.5}$ poises. Attaining such viscosities in alkali aluminosilicate display glasses normally involves maintaining a temperature above 750° C. in the glass to be molded.

In accordance with embodiments of the disclosed molding methods particularly applicable to display glass applications, the silicate glass charge is composed of a aluminosilicate glass having an alkali metal oxide content of at least of 10 weight percent and a softening temperature of at least 800° C. For economical practice, the mold that is used for shaping the glass sheet or other charge into an optically finished glass article comprises a mold body having a molding surface consisting predominantly of a metal selected from the group consisting of iron, nickel, chromium, copper, mixtures thereof, and alloys thereof, the molding surface being provided with a protective surface coating consisting essentially of titanium aluminum nitride.

The economic production of optically finished glass sheet products in accordance with the present disclosure requires that the molds used for manufacturing provide an extended service life. For that purpose, embodiments of the disclosed molding methods are practiced with molds wherein a diffusion barrier layer comprising amorphous aluminum oxide is provided between the molding surface and the protective surface coating, with that barrier layer acting to stabilize the coating against the deterioration that can result from the diffusion of metal from the metallic molding surface into the protective coating at high temperatures.

As noted above, glass sheet manufacture in accordance with the disclosed methods is best practiced with molds wherein the protective surface coatings on the molds have an RMS surface roughness not exceeding 25 nm Such coatings effectively enable the manufacture of optically finished glass sheet of similar or lower surface roughness, i.e., glass surfaces that are substantially free of optical defects.

While the methods and tools disclosed herein have been described above with respect to particular examples of materials, products and processes suitable for their practical application, it will be recognized that those examples have been presented for purposes of illustration only, and that various modifications of the disclosed methods and tools may be adapted for use in similar or other applications within the scope of the appended claims.

What is claimed is:

1. A refractory tool comprising a metallic tool body, a protective surface coating, an aluminum oxide-containing diffusion barrier layer disposed on the tool body and between the tool body and the protective surface coating, and a metal oxynitride transition layer disposed between the diffusion barrier layer and the protective surface coating, wherein the tool body has a surface consisting predominantly of a metal selected from the group consisting of iron, nickel, chromium, copper, mixtures thereof, and alloys thereof, and wherein the protective surface coating is a metal nitride coating consisting essentially of titanium nitride, titanium aluminum nitride, or combinations thereof and is resistant to mechanical, corrosive, and oxidative surface damage at use temperatures of up to 800° C.

2. A glass-forming mold comprising a mold body having a metallic molding surface, a refractory metal nitride surface coating disposed on at least a portion of the molding surface, a diffusion barrier layer comprising amorphous aluminum oxide disposed on the molding surface and between the molding surface and the metal nitride surface coating, and a metal oxynitride transition layer disposed between the diffusion barrier layer and the metal nitride surface coating, wherein the molding surface consists predominantly of a metal selected from the group consisting of iron, nickel, chromium, copper, mixtures thereof, and alloys thereof, and wherein the refractory metal nitride surface coating consists essentially of titanium nitride, titanium aluminum nitride, or combinations thereof and is resistant to mechanical, corrosive, and oxidative surface damage at use temperatures of up to 800° C.

3. A mold in accordance with claim 2 wherein the mold is formed of a metal selected from the group consisting of cast iron, steel, steel alloys, stainless steel alloys, and nickel alloys, wherein the surface coating has a Ti:Al atomic ratio of less than 1, and wherein Al comprises not more than 70% by weight of the total Al+Ti content of the coating.

4. A mold in accordance with claim 2 wherein the surface coating has a root mean square (RMS) surface roughness not exceeding 25 nm, wherein the RMS roughness is an average of measured height deviations from a mean linear surface of the glass sheet taken within an evaluation length or area.

5. A mold in accordance with claim 2 wherein the transition layer is an aluminum oxynitride or aluminum-titanium oxynitride.

6. A mold in accordance with claim 5 wherein the surface coating has a thickness of at least 1 μm, the transition layer has a thickness of at least 10 nm, and the barrier layer has a thickness of at least 200 nm.

7. A mold in accordance with claim 2 wherein a portion of the molding surface is coated with a nickel plating layer.

8. A mold in accordance with claim 2 wherein the mold comprises an electrically conductive region disposed on or within the barrier layer.

9. A mold in accordance with claim 8 wherein the electrically conductive region comprises an interconnected aluminum metal phase within at least a portion of the barrier layer, and wherein a metallic bonding layer is disposed between the barrier layer and the surface coating.

10. A mold in accordance with claim 8 wherein the electrically conductive region includes at least a portion of the barrier layer containing a ZnO dopant, and wherein an aluminum-titanium oxynitride transition layer is provided between the barrier layer and the surface coating.

11. A mold in accordance with claim 8 wherein the electrically conductive region comprises a conductive metal layer disposed over the barrier layer and in electrical contact with the molding surface.

12. A method for making a glass-forming mold, the method comprising the steps of: (i) selecting a mold body having a molding surface consisting predominantly of a metal selected from the group consisting of iron, chromium, nickel, copper, mixtures thereof, and alloys thereof; (ii) depositing an oxide diffusion barrier layer comprising amorphous aluminum oxide on at least a portion of the molding surface; (iii) depositing a metal oxynitride transition layer on the diffusion barrier layer; and (iv) depositing a metal nitride surface coating consisting essentially of titanium nitride, titanium aluminum nitride, or combinations thereof on the metal oxynitride transition layer, wherein the metal nitride surface coating is resistant to mechanical, corrosive, and oxidative surface damage at use temperatures of at least 800° C.

13. A method in accordance with claim 12 wherein the step of depositing the surface coating comprises depositing a coating consisting predominantly of titanium aluminum nitride.

14. A method in accordance with claim 13 wherein the surface coating is deposited by reactive sputtering from a Ti—Al source, and wherein sputtering is carried out while maintaining an electrical bias between the source and the barrier layer.

15. A method in accordance with claim 12 wherein the transition layer is an aluminum oxynitride or aluminum-titanium oxynitride.

16. A method in accordance with claim 12 wherein the step of depositing the transition layer comprises a vapor deposition step in a gas atmosphere, and wherein the oxygen content is decreased and the nitrogen content is increased in the gas atmosphere during the vapor deposition step.

17. A method in accordance with claim 12 wherein the step of depositing the barrier layer comprises non-reactively sputtering a layer comprising an electrically conductive mixture of amorphous aluminum oxide and metallic aluminum, and thereafter depositing an Al or AlTi bonding layer onto the electrically conductive mixture.

18. A method in accordance with claim 12 wherein the step of depositing the barrier layer comprises vapor-depositing an electrically conductive layer of amorphous alumina doped with ZnO.

19. A method in accordance with claim 12 comprising a further step, prior to depositing the surface coating, of depositing a conductive metal interlayer over the barrier layer and onto at least a portion of the molding surface.

20. A method in accordance with claim 19 wherein the conductive metal interlayer comprises titanium-aluminum alloy.

21. A glass-forming mold comprising a mold body having a metallic molding surface, a refractory metal nitride surface coating disposed on at least a portion of the molding surface, a diffusion barrier layer comprising amorphous aluminum oxide disposed between the molding surface and the surface coating, and an electrically conductive region disposed on or within the barrier layer, wherein the electrically conductive region comprises an interconnected aluminum metal phase within at least a portion of the barrier layer, and wherein a metallic bonding layer is disposed between the barrier layer and the surface coating.

22. A mold in accordance with claim 21, wherein the molding surface consists predominantly of a metal selected from the group consisting of iron, nickel, chromium, copper, mixtures thereof, and alloys thereof, and wherein the surface coating consists essentially of titanium aluminum nitride.

23. A mold in accordance with claim 22, wherein the mold is formed of a metal selected from the group consisting of cast iron, steel, steel alloys, stainless steel alloys, and nickel alloys, wherein the surface coating has a Ti:Al atomic ratio of less than 1, and wherein Al comprises not more than 70% by weight of the total Al+Ti content of the coating.

24. A mold in accordance with claim 22, wherein the surface coating has a root mean square (RMS) surface roughness not exceeding 25 nm, wherein the RMS roughness is an average of measured height deviations from a mean linear surface of the glass sheet taken within an evaluation length or area.

25. A mold in accordance with claim 21, wherein an aluminum oxynitride or aluminum-titanium oxynitride transition layer is disposed between the barrier layer and the surface coating.

26. A mold in accordance with claim 21, wherein a portion of the molding surface is coated with a nickel plating layer.

27. A mold in accordance with claim 21, wherein the electrically conductive region comprises a conductive metal layer disposed over the barrier layer and in electrical contact with the molding surface.

28. A glass-forming mold comprising a mold body having a metallic molding surface, a refractory metal nitride surface coating disposed on at least a portion of the molding surface, a diffusion barrier layer comprising amorphous aluminum oxide disposed between the molding surface and the surface coating, and an electrically conductive region disposed on or within the barrier layer, wherein the electrically conductive region includes at least a portion of the barrier layer containing a ZnO dopant, and wherein an aluminum-titanium oxynitride transition layer is provided between the barrier layer and the surface coating.

29. A mold in accordance with claim 28, wherein the molding surface consists predominantly of a metal selected from the group consisting of iron, nickel, chromium, copper, mixtures thereof, and alloys thereof, and wherein the surface coating consists essentially of titanium aluminum nitride.

30. A mold in accordance with claim 29, wherein the mold is formed of a metal selected from the group consisting of cast iron, steel, steel alloys, stainless steel alloys, and nickel alloys, wherein the surface coating has a Ti:Al atomic ratio of less than 1, and wherein Al comprises not more than 70% by weight of the total Al+Ti content of the coating.

31. A mold in accordance with claim 29, wherein the surface coating has a root mean square (RMS) surface roughness not exceeding 25 nm, wherein the RMS roughness is an average of measured height deviations from a mean linear surface of the glass sheet taken within an evaluation length or area.

32. A mold in accordance with claim 28, wherein an aluminum oxynitride or aluminum-titanium oxynitride transition layer is disposed between the barrier layer and the surface coating.

33. A mold in accordance with claim 28, wherein a portion of the molding surface is coated with a nickel plating layer.

34. A mold in accordance with claim 28, wherein the electrically conductive region comprises a conductive metal layer disposed over the barrier layer and in electrical contact with the molding surface.

\* \* \* \* \*